United States Patent
Kwon et al.

(10) Patent No.: US 7,863,928 B2
(45) Date of Patent: Jan. 4, 2011

(54) DATA LINE TERMINATION CIRCUIT

(75) Inventors: Yong Kee Kwon, Gyeonggi-do (KR); Hyung Dong Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/403,549

(22) Filed: Mar. 13, 2009

(65) Prior Publication Data
US 2009/0256585 A1    Oct. 15, 2009

(30) Foreign Application Priority Data
Apr. 10, 2008  (KR) .................... 10-2008-0032994

(51) Int. Cl.
*H03K 17/16* (2006.01)
(52) U.S. Cl. ........................................ 326/30
(58) Field of Classification Search .................. 326/30
See application file for complete search history.

(56) References Cited
U.S. PATENT DOCUMENTS

| | | |
|---|---|---|
| 5,327,317 A | 7/1994 | Lee |
| 5,729,152 A | 3/1998 | Leung et al. |
| 7,157,931 B2 | 1/2007 | Song |
| 2008/0112246 A1* | 5/2008 | Mei ........................ 365/210.1 |

FOREIGN PATENT DOCUMENTS

KR    1020060038234 A    5/2006

\* cited by examiner

*Primary Examiner*—Rexford N Barnie
*Assistant Examiner*—Thienvu V Tran
(74) *Attorney, Agent, or Firm*—Ladas & Parry LLP

(57) ABSTRACT

A data line termination circuit includes a swing-width sensing unit configured to sense a swing width of a voltage of a data line and output a sensed signal, and a variable termination unit configured to adjust a termination resistance value of the data line in response to the sensed signal. The swing-width sensing unit can sense if the swing width is less than or greater than a predetermined swing width, and the swing width of the voltage of the data line can be reduced or increased to maintain the voltage of the data line within a predetermined range.

6 Claims, 4 Drawing Sheets

DATA LINE TERMINATION CIRCUIT

CROSS-REFERENCES TO RELATED PATENT APPLICATION

The present application claims priority under 35 U.S.C 119(a) to Korean Application No. 10-2008-0032994, field on Apr. 10, 2008, in the Korean Intellectual Property Office, which is incorporated herein by reference in its entirety as set forth in full.

BACKGROUND

Technical Field

Embodiments described herein relate generally to a semiconductor integrated circuit, and more particularly, to a data line termination circuit.

Semiconductor integrated circuits, such as DRAM devices, include data lines. One example of data lines is the global I/O lines used for transmitting data. Semiconductor integrated circuits use termination circuits to restrict the swing width of the voltage of the respective data lines in order to reduce current consumption or increase operation speed.

FIG. 1 is a circuit diagram illustrating a data line termination circuit for a semiconductor integrated circuit.

Referring to FIG. 1, the termination circuit reduces the swing width of the voltage of the data line GIO in response to a termination control signal t_cont. The level of the voltage of the data line GIO depends upon the resistance values of termination resistors R1 and R2 and the data line GIO. Referring to FIG. 2, if the termination control signal t_cont transitions from a logic high level to a logic low level, a first transistor M1 and a second transistor M2 are turned ON, such that the swing width of the voltage of the data line GIO is reduced to a level dependent upon the resistance of the respective termination resistors R1 and R2.

The swing width of the voltage of the data line is influenced by various factors, including the topology of data passing through the data line, operation frequency, the data transmission path, and the coupling effect between the data line and a neighboring data line. Moreover, the swing width of the voltage of the data line influences both current consumption and operational speed.

SUMMARY

There is herein disclosed a data line termination circuit capable of maintaining the swing width of the voltage of a data line within a predetermined range when the device is subjected to various conditions.

In one aspect, a data line termination circuit includes: a swing-width sensing unit configured to sense a swing width of a voltage of a data line and output a sensed signal; and a variable termination unit configured to adjust a termination resistance value of the data line in response to the sensed signal.

The data line termination circuit of the aspect of the invention can maintain the swing width of the voltage of a data line within a predetermined range, and is thereby capable of coping with variations in the swing width of the voltage of the data line allowing for a decrease in current consumption and prevention of degradation of data transmission capabilities.

These and other features, aspects, and embodiments are described below in the section "Detailed Description".

BRIEF DESCRIPTION OF THE DRAWINGS

Features, aspects, and embodiments are described in conjunction with the attached drawings, in which.

DETAILED DESCRIPTION

Hereinafter, an exemplary embodiment of the invention will be described in detail with reference to the accompanying drawings.

Figure 1:
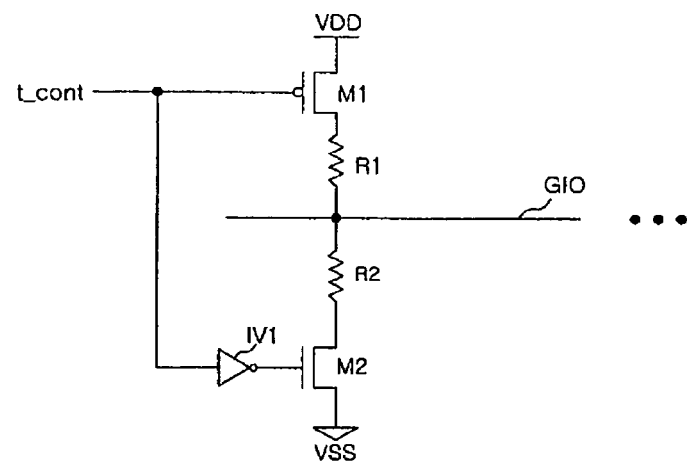
FIG. 1 is a circuit diagram illustrating a data line termination circuit for a semiconductor integrated circuit.
Figure 2:
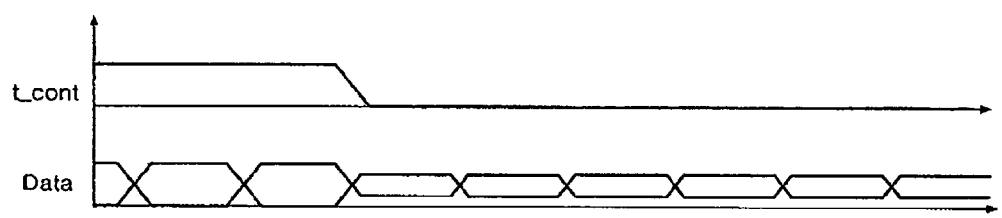
FIG. 2 is a diagram illustrating the waveform of the output of the data line termination circuit illustrated in FIG. 1.
Figure 3:
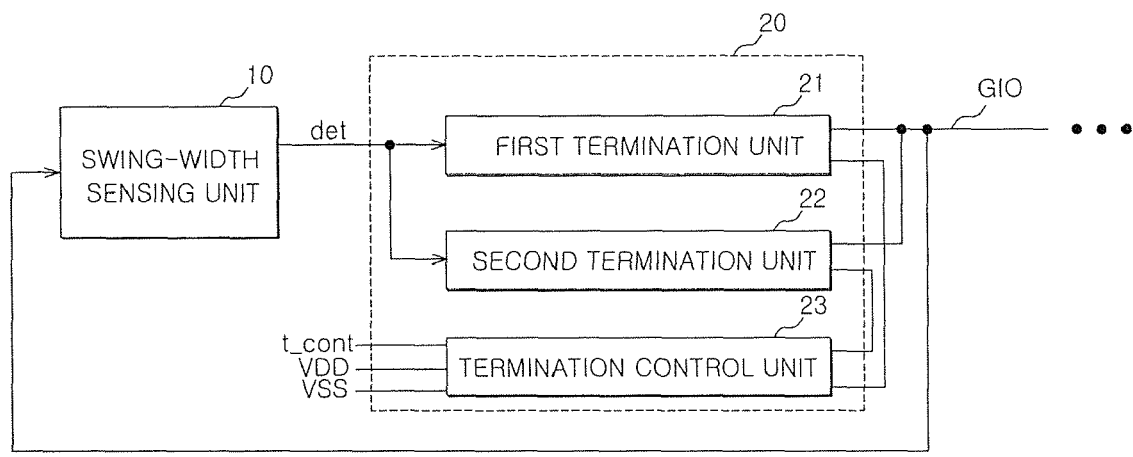
FIG. 3 is a block diagram showing an exemplary data line termination circuit according to an embodiment of the present invention.

FIG. 3 is a block diagram showing an exemplary data line termination circuit according to an embodiment of the present invention.

The data line termination circuit shown in FIG. 3 includes a swing-width sensing unit 10 and a variable termination unit 20.

The swing-width sensing unit 10 can be configured to sense the swing width of the voltage of a data line GIO and output a sensed signal 'det'.

The variable termination unit 20 can be configured to adjust termination resistance values of the data line GIO in response to the sensed signal 'det'.

To allow for the adjustment, the variable termination unit 20 can include a first termination unit 21, a second termination unit 22, and a termination control unit 23.

The first termination unit 21 can set a first termination resistance value in response to the sensed signal 'det', and the second termination unit 22 can set a second termination resistance value in response to the sensed signal 'det'.

In response to a termination control signal 't_cont', the termination control unit 23 can adjust the swing width of the voltage of the data line GIO using the resistance value set by the first termination unit 21 or the resistance value set by the second termination unit 22.

Figure 4:
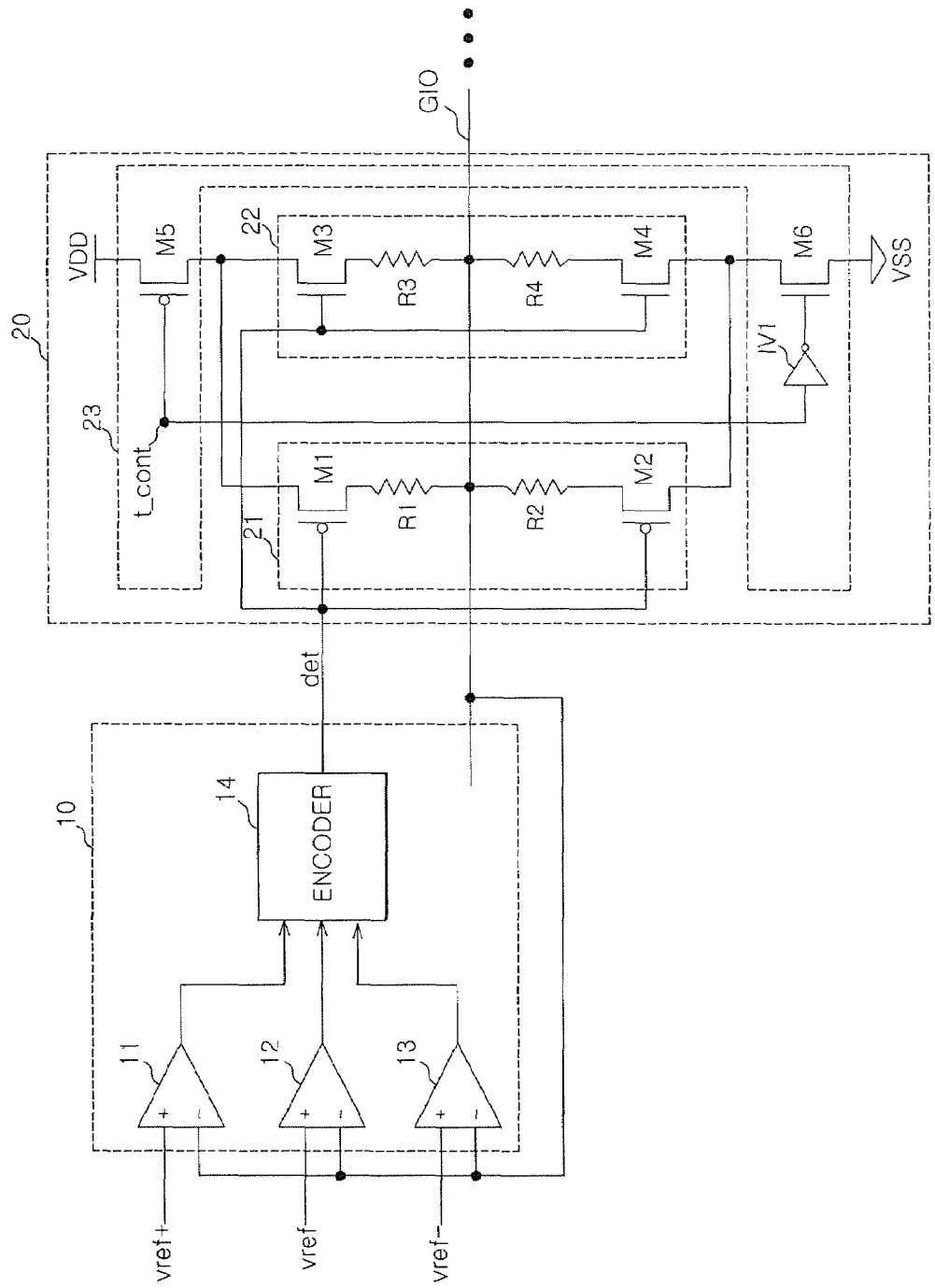
FIG. 4 is a circuit diagram showing the exemplary data line termination circuit shown in FIG. 3.

FIG. 4 is a circuit diagram showing the exemplary data line termination circuit shown in FIG. 3.

The swing-width sensing unit 10 can include a first comparator 11, a second comparator 12, a third comparator 13, and an encoder 14.

The first comparator 11 can compare the voltage of the data line GIO with a first reference voltage 'Vref+'. The second comparator 12 can compare the voltage of the data line GIO with a second reference voltage 'Vref'. The third comparator 13 can compare the voltage of the data line GIO with a third reference voltage 'Vref−'.

The first reference voltage 'Vref+', the second reference voltage 'Vref', and the third reference voltage 'Vref−' serve as a reference for sensing the swing width of the voltage of the data line GIO. For example, the first, second, and third reference voltages 'Vref+', 'Vref', 'Vref−' can be used to define boundaries of a predetermined swing width that are compared to the swing width of the data line GIO. For example, the first reference voltage 'Vref+' may be set to 0.75 VDD, the second reference voltage 'Vref' may be set to 0.5 VDD, and the third reference voltage 'Vref−' may be set to 0.25 VDD. Here, "VDD" represents a source voltage.

The encoder 14 can be configured to encode the outputs of the first to third comparators 11 to 13 and then outputs the encoded signal as the sensed signal 'det'. For example, if the outputs of the first to third comparators 11 to 13 all have the same logic level, for example, a logic high level or a logic low level, the encoder 14 may output the sensed signal 'det' to have a logic high level. Otherwise, the encoder 14 may output the sensed signal 'det' to have a logic low level.

The first termination unit 21 can be configured to set the resistance value of the data line GIO to the first termination resistance value when the sensed signal 'det' is at a first logic level.

The first termination unit 21 can include a first transistor M1, a second transistor M2, a first resistor R1, and a second resistor R2. The first resistor R1 and the second resistor R2 can be connected in series between the first transistor M1 and the second transistor M2 and serve as a voltage divider for controlling the level of the voltage of the data line GIO. The first transistor M1 and the second transistor M2 are turned ON according to the logic level of the sensed signal 'det'. Thus, when the first and second transistors M1 and M2 receive the first logic level (e.g., a logic low level in the embodiment of the present invention shown in FIG. 4), the first termination unit sets the resistance value of the data line GIO using the first and second resistors R1 and R2.

The second termination unit 22 can be configured to set the resistance value of the data line GIO to the second termination resistance value when the sensed signal 'det' is at a second logic level.

The second termination unit 22 can include a third transistor M3, a fourth transistor M4, and a third resistor R3, and a fourth resistor R4. The third resistor R3 and the fourth resistor R4 can be connected in series between the third transistor M3 and the fourth transistor M4 and server as a voltage divider for controlling the level of the voltage of the data line GIO. The third transistor M3 and the fourth transistor M4 are turned ON according to the logic level of the sensed signal 'det'. Thus, when the third and fourth transistors M3 and M4 receive the second logic level (e.g., a logic high level in the embodiment of the present invention shown in FIG. 4), the second termination unit sets the resistance value of the data line GIO using the third and fourth resistors R3 and R4.

The termination control unit 23 can include a first inverter IV1, a fifth transistor MS, and a sixth transistor M6. The first inverter IV1 can receive the termination control signal 't_cont'. The fifth transistor MS can be turned ON in response to the termination control signal 't_cont' (e.g., in the embodiment of the present invention shown in FIG. 4, the fifth transistor can be turned on when the termination control signal 't_cont' is at a logic low level), and the sixth transistor M6 can be turned ON in response to an output of the first inverter IV1 (e.g. in the embodiment of the present invention shown in FIG. 4, the sixth transistor can be turned on when the termination control signal 't_cont' is at a logic low level and is inverted by the first inverter IV1 to a logic high level).

The operation of the data line termination circuit according to the embodiment is described in more detail below.

For the purpose of illustrating the operation of the data line termination circuit according to an embodiment of the present invention, the resistance value of the second termination unit 22 is assumed to be greater than the resistance value of the first termination unit 21, although it should be understood that the present invention is not limited as such.

Additionally, for the purpose of illustration, the first to third reference voltages 'Vref+', 'Vref', and 'Vref−' will be described as having voltage levels 0.75 VDD, 0.5 VDD, and 0.25 VDD, respectively, where "VDD" represents the source voltage.

Figure 5:
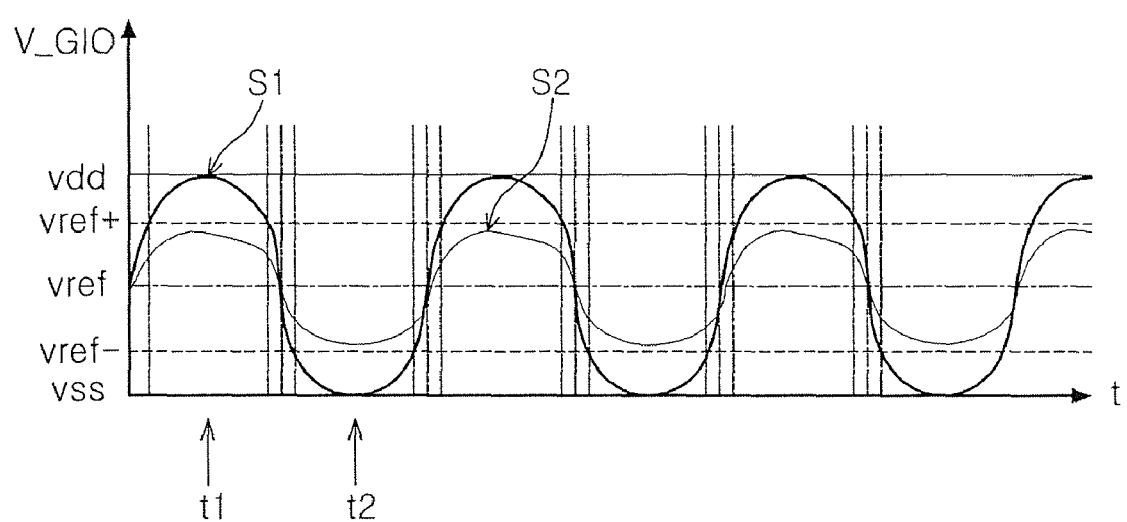
FIG. 5 is a diagram shown for illustrating a waveform of the voltage of the data line shown in FIG. 4.

Referring to FIGS. 4-5, in the exemplary embodiment of the present invention, if the swing width of the voltage of the data line GIO is less than a predetermined width (e.g., refer to reference symbol S2 of FIG. 5) when the level of the voltage of the data line GIO is sensed at a first time point t1, the first to third comparators 11 to 13 can output a low-level signal, a high-level signal, and a high-level signal, respectively. Further, when the level of the voltage of the data line GIO is sensed at a second time point t2 (refer to reference symbol S2 of FIG. 5), the first to third comparators 11 to 13 can output a low-level signal, a low-level signal, and a high-level signal, respectively.

If the outputs of the first to third comparators 11 to 13 all have the same logic level, for example, the logic high level or the logic low level, the encoder 14 can be configured to output the sensed signal 'det' such that the sensed signal 'det' has a logic high level, and otherwise, the encoder 14 can be configured to output the sensed signal 'det' to have a logic low level.

In the above-mentioned case, since all of the signals input to the encoder 14 do not each have either the logic high level or the logic low level, the encoder 14 can output the sensed signal 'det' to have the logic low level (e.g., the swing width is determined to be less than a predetermined width).

As such, the first termination unit 21 of the variable termination unit 20 is driven in response to the sensed signal 'det' having the logic low level such that the swing width of the voltage of the data line GIO is determined according to the resistance value of the first termination unit 21.

Meanwhile, if the swing width of the voltage of the data line GIO is greater than a predetermined width (e.g., refer to reference symbol S1 of FIG. 5) when the level of the voltage of the data line GIO is sensed at the first time point t1, the first to third comparators 11 to 13 of the swing-width sensing unit 10 can output a high-level signal, a high-level signal, and a high-level signal, respectively. Further, when the level of the voltage of the data line GIO is sensed at the second time point t2 (refer to reference symbol S1 of FIG. 5), the first to third comparators 11 to 13 can output a low-level signal, a low-level signal, and a low-level signal, respectively.

When the level of the voltage of the data line GIO is sensed at the first time point t1 or the second time point t2, the outputs of the first to third comparators 11 to 13 each have either the logic high level or the logic low level. Therefore, the encoder 14 can be configured to output the sensed signal 'det' to have a logic high level.

Since the sensed signal 'det' has the logic high level as described above, the second termination unit 22 of the variable termination unit 20 is driven in response to the sensed signal 'det' having the logic high level. Moreover, since second termination unit 22 is configured to have a resistance value that is greater than the resistance value of the first termination unit 21, the termination control unit 23 of the variable termination unit 20 can reduce the level and swing width of the voltage of the data line GIO.

As a result, if the swing width of the voltage of the data line GIO exceeds the predetermined width, the second termination unit 22 can be driven to reduce the swing width of the voltage of the data line GIO.

In the embodiment of the present invention described above, it was assumed that the resistance value of the second termination unit 22 is greater than that of the first termination unit. Hereinafter, the operation of the data line termination circuit of an embodiment of the present invention will be described while assuming that the resistance value of the first termination unit 21 is greater than the resistance value of the second termination unit 22.

If the swing width of the voltage of the data line GIO is reduced to be less than a predetermined width, the variable termination unit 20 can turn ON the second termination unit 22, which has a relatively smaller resistance value than that of the first termination unit 21. Then, the second termination unit 22 of the variable termination unit 20 can increase the swing width of the voltage of the data line GIO.

Embodiments of the present invention can be configured to drive a termination unit having a relatively greater resistance value if the swing width of the voltage of the data line GIO exceeds a predetermined level in order to reduce the swing width of the voltage of the data line GIO. Also, embodiments of the present invention can be configured to drive a termination unit having a relatively smaller resistance value if the swing width of the voltage of the data line GIO is less than the predetermined level in order to increase the swing width of the voltage of the data line GIO. Therefore, even when the swing width of the voltage of the data line GIO is varied due to factors such as the topology of data, the operation frequency, the data transmission path, the coupling effect with a neighboring data line, etc.; embodiments of the present invention can adjust the swing width of the voltage of the data line GIO to maintain the swing width of the voltage of the data line GIO within a predetermined range. Accordingly, embodiments of the present invention can improve data transmission capability and prevent loss of current.

While certain embodiments have been described above, it will be understood that the embodiments described are by way of example only.

Accordingly, the device and method described herein should not be limited based on the described embodiments. Rather, the devices and methods described herein should only be limited in light of the claims that follow when taken in conjunction with the above description and accompanying drawings.

What is claimed is:

1. A data line termination circuit comprising:
 a swing-width sensing unit configured to sense a swing width of a voltage of a data line and to output a sensed signal according to the sensed swing width; and
 a variable termination unit configured to adjust a termination resistance value of the data line according to the sensed signal, wherein the variable termination unit comprises:
  a first termination unit configured to set a resistance value of the data line to a first termination resistance value according to the sensed signal; and
  a second termination unit configured to set the resistance value of the data line to a second termination resistance value according to the sensed signal;
 wherein the swing-width sensing unit is configured to compare the voltage of the data line with each of a plurality of reference voltages and to output the sensed signal having a logic level that is a first logic level or a second logic level, wherein the logic level is determined based upon whether the results of the comparison of each of the plurality of reference voltages with the voltage of the data line are the same,
 wherein the swing-width sensing unit comprises:
  a first comparator configured to compare the voltage of the data line with a first reference voltage;
  a second comparator configured to compare the voltage of the data line with a second reference voltage;
  a third comparator configured to compare the voltage of the data line with a third reference voltage; and
  an encoder configured to encode outputs of the first to third comparators in order to output the sensed signal,
  wherein the encoder is configured to output the sensed signal such that the logic level is the first logic level if the outputs of each of the first to third comparators have the same logic levels, and configured to output the sensed signal having the second logic level if the outputs of the first to third comparators all do not have the same logic level.

2. The data line termination circuit of claim 1, wherein the second termination resistance value of the second termination unit is greater than the first termination resistance value of the first termination unit.

3. The data line termination circuit of claim 2, wherein when the swing width sensing unit senses that the swing width of the voltage of the data line is greater than a predetermined swing width, the second termination unit is driven in order to reduce the swing width of the voltage of the data line.

4. The data line termination circuit of claim 1, wherein the first termination resistance value of the first termination unit is greater than the second termination resistance value of the second termination unit.

5. The data line termination circuit of claim 4, wherein when the swing width sensing unit senses that the swing width of the voltage of the data line is less than a predetermined swing width, the second termination unit is driven in order to increase the swing width of the voltage of the data line.

6. The data line termination circuit of claim 1, wherein the variable termination unit further comprises a termination control unit which deactivates the first termination unit or the second termination unit in response to a termination control signal.

* * * * *